(12) United States Patent
Hankins et al.

(10) Patent No.: US 7,343,019 B2
(45) Date of Patent: Mar. 11, 2008

(54) STREAMING NORMALIZATION

(75) Inventors: Timothy C. Hankins, Gainesville, FL (US); Thomas Millikan, Austin, TX (US); Christopher A. Scarr, Houston, TX (US); Jason Kridner, Houston, TX (US); Gabriel Dagani, Bluffton, OH (US)

(73) Assignee: Texas Instruments Incorporated, Dallas, TX (US)

( * ) Notice: Subject to any disclaimer, the term of this patent is extended or adjusted under 35 U.S.C. 154(b) by 900 days.

(21) Appl. No.: 10/202,755

(22) Filed: Jul. 25, 2002

(65) Prior Publication Data

US 2003/0059064 A1 Mar. 27, 2003

Related U.S. Application Data

(60) Provisional application No. 60/308,066, filed on Jul. 25, 2001.

(51) Int. Cl.
  *H03G 3/00* (2006.01)
  *H03G 9/00* (2006.01)
  *H03G 7/00* (2006.01)
  *G06F 17/00* (2006.01)
  *G10L 11/00* (2006.01)
  *G10L 19/00* (2006.01)

(52) U.S. Cl. .............. 381/107; 381/104; 381/109; 381/102; 381/106; 700/94; 704/278; 704/500

(58) Field of Classification Search ............ 381/107, 381/104, 106, 108; 700/94; 709/217, 231, 709/218, 219; 704/278, 500
See application file for complete search history.

(56) References Cited

U.S. PATENT DOCUMENTS

| | | | | |
|---|---|---|---|---|
| 5,267,322 A | * | 11/1993 | Smith et al. | 381/107 |
| 7,082,106 B2 | * | 7/2006 | Sharma et al. | 370/276 |
| 7,107,109 B1 | * | 9/2006 | Nathan et al. | 700/94 |

* cited by examiner

*Primary Examiner*—Vivian Chin
*Assistant Examiner*—Devona E Faulk
(74) *Attorney, Agent, or Firm*—W. James Brady, III; Frederick J. Telecky, Jr.

(57) ABSTRACT

A normalization for streaming digital audio signals applies a gain factor according to the maximum sample magnitude in a window of samples and compare the gain factor to prior gain factors to adjust the gain factor for the samples in the window of samples. Adaptation of the gain factor with rapid decreases but slow increases avoids saturation but allows quiet passages.

3 Claims, 2 Drawing Sheets

STREAMING NORMALIZATION

CROSS-REFERENCE TO RELATED APPLICATIONS

This application claims priority from provisional patent application Ser. No. 60/308,066, filed Jul. 25, 2001.

BACKGROUND

The present invention relates to electronic devices, and more particularly to methods and devices for playout of digital audio signals.

Digital audio has become widespread for both stored media (e.g., CDs) and streaming media (e.g., real-time from the Internet). For stored digital audio the entire file is available, so the dynamic range can be assessed. Contrarily, for streaming audio such as over the Internet, only the current portion and the past of the file being played is available, so the future dynamic range, in both the short run and the long run, cannot be assessed. This inhibits optimal usage of the playout system.

SUMMARY OF THE INVENTION

The present invention provides a normalization for playout of streaming signals; the normalization boosts quite small signal portions to take advantage of system dynamic range but quickly drops the boost in response to increases in the signal magnitude.

Advantages include use of full dynamic range for streaming audio.

BRIEF DESCRIPTION OF THE DRAWINGS

The Figures are heuristic for clarity

DESCRIPTION OF THE PREFERRED EMBODIMENTS

1. Overview

Figure 1:
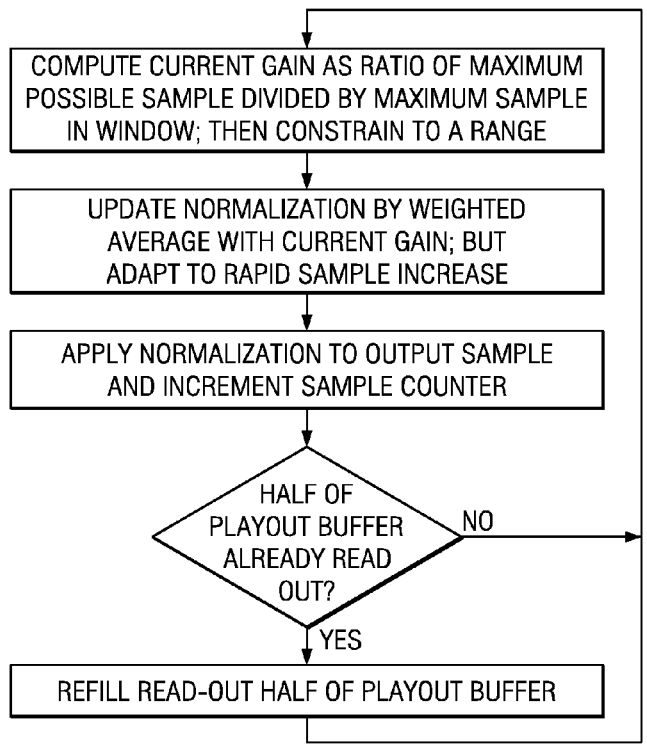
FIG. 1 is a flow diagram for a preferred embodiment.
Figure 2:
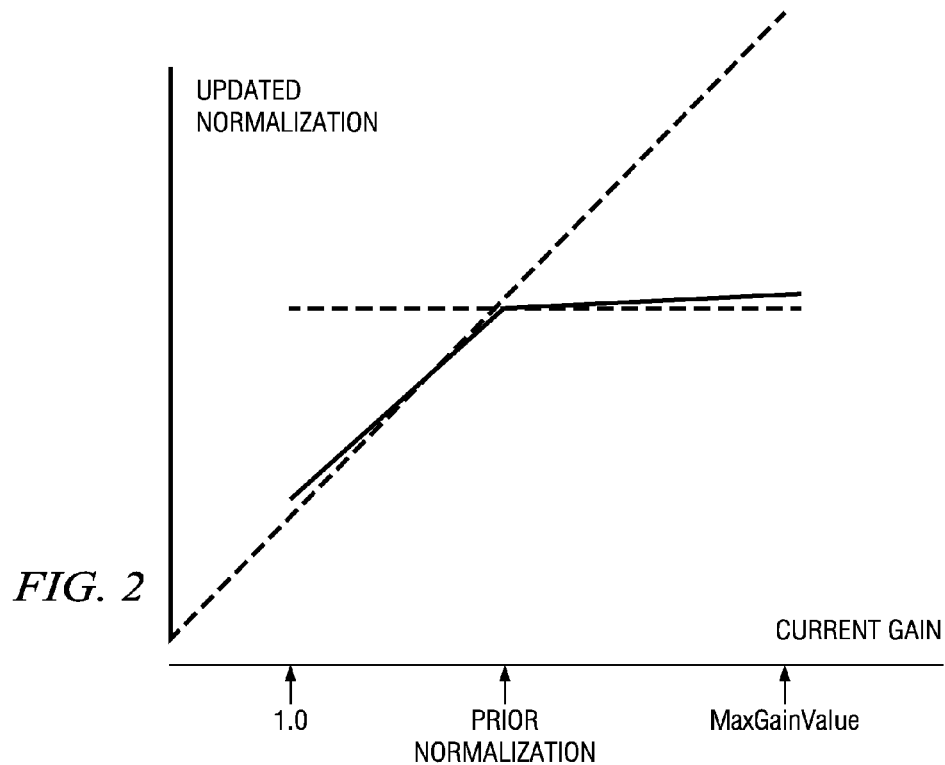
FIG. 2 illustrates preferred embodiment updating.
Figure 3:
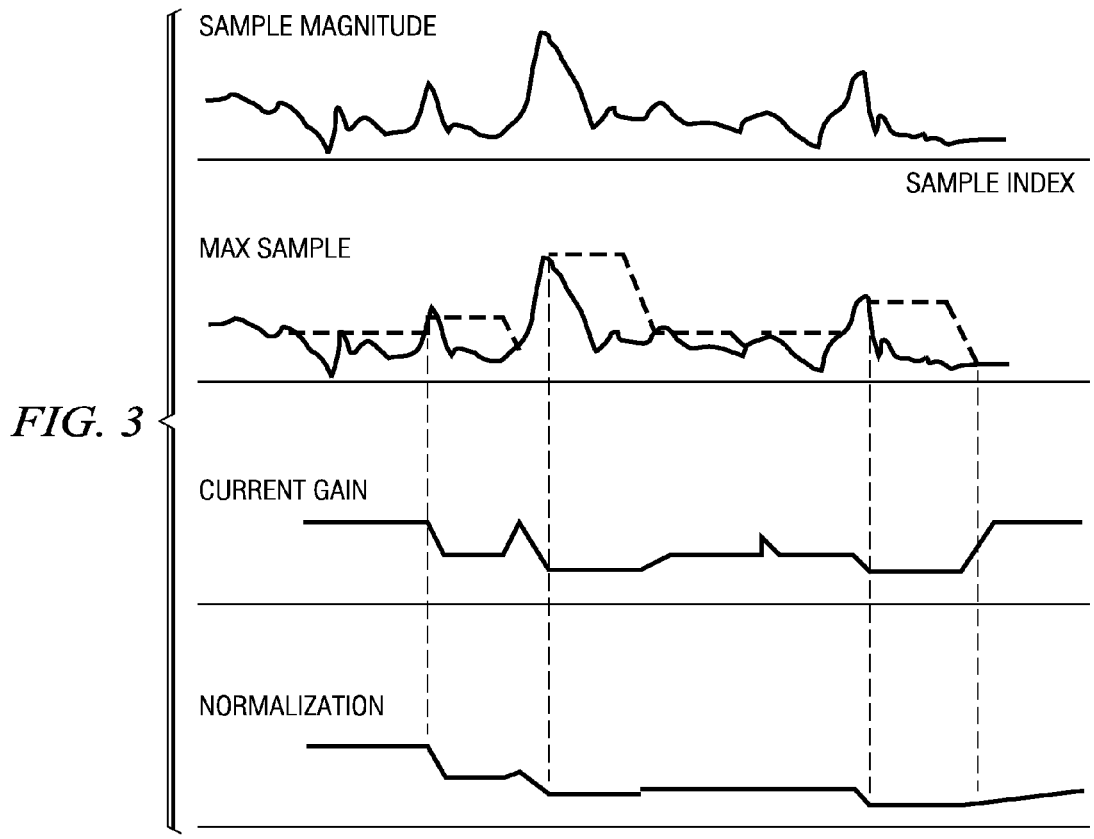
FIG. 3 is an example.

Preferred embodiments provide methods of normalization (dynamic automatic gain control) for streaming digital audio; this allows optimal use of the dynamic range of the playout system. The methods analyze incoming samples and determine a normalization based on both the short-term and the long-term characteristics of the received samples. Initially, the normalization is held at 1.0 to learn something about the incoming signal, and thereafter it follows the reciprocal of a long-term average of sample magnitudes except it avoids saturation by rapid decrease for large short-term signal increases. FIG. 1 is a flow diagram, and FIG. 3 illustrates the normalization determination from incoming sample magnitudes. FIG. 2 shows the updating of the normalization in terms of the current short-term gain.

Figure 4:
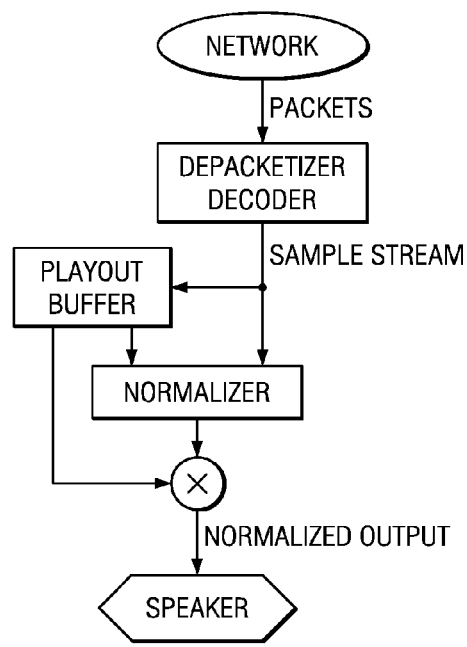
FIG. 4 shows a preferred embodiment system functional blocks.

FIG. 4 indicates the functional blocks of preferred embodiment systems which use the preferred embodiment playout methods. This applies to digital music and speech and also other audio signals or other streaming signals with normalization aspects. The methods can be performed with digital signal processors (DSPs) or general purpose programmable processors or application specific circuitry or systems on a chip such as both a DSP and RISC processor on the same chip with the RISC processor controlling. A stored program in an onboard or external ROM, flash EEPROM, or ferroelectric memory for a DSP or programmable processor could perform the signal processing. Analog-to-digital converters and digital-to-analog converters provide coupling to the real world, and modulators and demodulators (plus antennas for air interfaces) provide coupling for transmission. The encoded audio signals can be packetized and transmitted over networks such as the Internet with the playout buffer also providing packet reception jitter control.

Generally, after any depacketization of signals to a playout buffer, the preferred embodiments window the incoming samples (window size N) and determine the maximum sample value in the current window of N samples. From the maximum sample value in the current window, compute a current gain factor, gFc, needed to normalize this maximum sample value. For example, the normalization may simply be the ratio of a system arbitrary maximum sample value divided by the maximum sample value of the current window. Use the information in gFc for the current window together with the gFc's of onr or more prior windows to compute a normalization gain for the samples of the current window or for a subset of K of the N samples of the current window (including a normalization for a single sample of the current window).

For example, the normalization gain for the current window could be a simple function of the gFc of the current window and the normalization gain of a prior window such as (i) normalization gain of current window equals gFc if gFc is smaller than the normalization gain of a prior window and (ii) normalization gain of the current window is a linear combination of gFc and the normalization gain of a prior window if gFc is greater than the normalization gain of a prior window. That is, the example normalization gain tracks gFc when decreasing (samples increasing in size) relative to prior windows normalization and slowly increases by weighting with gFc when increasing (samples decreasing in size) relative to prior windows.

2. First Preferred Embodiments

In a first preferred embodiment system (e.g., FIG. 4) an incoming stream of samples of audio information is depacketized, decoded, and dumped into a playout buffer (for jitter control) for subsequent uniform read out plus normalization (scaling gain) to drive speakers or headphones. The preferred embodiments determine and apply a streaming normalization (gain) to the samples as read from the playout buffer as follows.

First, take the variable Count as a counter to indicate the sample to be output to the speakers (digital or a DAC plus analog speakers). Further, presume the circular playout buffer is full and contains 128 samples (two blocks of 64 samples) and thus the sample in the playout buffer to be output is at buffer index Count %128; where % is the modulo operator and the buffer index lies in the range 0 to 127. Each sample is 16 bits: 1 sign bit and 15 magnitude bits, so the maximum possible sample magnitude is 32K. The decoded stream typically represents audio samples taken at a sampling rate of 44.1 or 48 kHz, so a block of 64 samples covers a little more than 1 millisecond of the original audio signal.

Next, compute a current sample gain gFc by dividing the maximum magnitude 32K by the actual maximum sample magnitude in a window of 64 samples ending at the sample to be read out; that is, compute the maximum of the samples at buffer indices (Count-63)%128 through Count %128. Then constrain gFc to the range 1.0 to 3.47; note that gFc varies as the reciprocal of the actual maximum sample magnitude.

Update the normalization. Let gFp denote the normalization applied to the immediately preceding output sample, that is, the sample at (Count-1)%128. The update method depends upon the relative sizes of gFc and gFp: if gFc≧gFp, then take updated gFp=0.9999984 gFp+0.0000016 gFc; whereas, if gFc<gFp, then take updated gFp=0.03 gFp+0.97 gFc. FIG. 2 illustrates the piecewise linear function nature of the updating of the normalization: the horizontal axis variable is gFc, the vertical axis variable is the updated gFp, and the point labeled "prior Normalization" on the horizontal axis is the old gFp value. FIG. 3 shows an example. In particular, when the magnitude of the sample to be output is larger than that of any of the preceding 64 samples (so gFc drops), gFp will track gFc down. Contrarily, when the output sample is not a local maximum (so gFc is not dropping), the normalization will only slowly trend up to the long-term average.

Read out the sample at index Count % 128 in the playout buffer and apply (multiply by) the normalization gFp to the output sample.

Increment Count and check Count % 128, if Count % 128 equals 64, read in the next 64 samples to locations 0-63 in the playout buffer; this overwrites already-played-out samples. If Count % 128 equals 0, read in the next 64 samples to locations 64-127 in the playout buffer.

Lastly, repeat the foregoing steps for the next output sample and updated normalization until there are no more incoming samples.

3. Second Preferred Embodiment

A second preferred embodiment is analogous to the foregoing first preferred embodiment plus includes a long-term averaging control of the normalization. In particular, when the average sample magnitude over the last 1024 samples exceeds a level of 5000 (out of the maximum possible sample magnitude of 32K), trend the normalization towards 1.0 by updating gFp=0.9999 gFp+0.0001 and further when gFp<1.03, round down to gFp=1.0.

Code for the second preferred embodiment as applied to RIFF files could be as follows with various file naming, opening, and closing operations omitted for clarity plus some alternatives as to constants and gain adaptations indicated.

```
typedef struct           /* Stores the complete riff header*/
{
    char riff [4];               /* 4 bytes "riff" */
    long int length;             /* file length */
    char wave[4];                /* 4 bytes "wave" */
    char format[4];              /* 4 bytes "fmt_" */
    long int filler;             /* 4 bytes filler */
    unsigned short int fmt;      /* holds pcm or other format specifier */
    unsigned short int channels;/* number of channels */
    unsigned long int sample_rate;
    unsigned long int buffer;
    unsigned short int align;
    unsigned short int bits;     /* number of bits per sample */
    char data[4];                /* 4 bytes "data" */
    unsigned long int bytes; /* total # of samples in the data */
}RIFF_PCM;
/*---------Constants-------------*/
#define InSize            64
//#define HistWinSize     16
#define MaxGainValue      3.47 /* alternative values 2.03 and 4.47 */
#define NormalizationLevel 32767 /* alternative values 22000 and 27383 */
#define AvgWindowLength   1024
#define TriggerLevel      5000 /* alternative values 3750 and 2500,
depending
                                           on NormalizationLevel */
/*----------Globals--------------*/
int               bufferHalf;
float             tempBuffer[InSize * 2];
float             maxSample;
float             gFcurrent;
float             gFpast;
float*            write;
short int         tempBufferInt[InSize];
short int         outSamples[InSize];
unsigned long int prevCount;
/*Averaging */
float             sum                            = 0;
float             avgBuffer[AvgWindowLength]     = {0};
unsigned int      denominator                    = 0;
unsigned int      average                        = 0;
unsigned long int avgCounter                     = 1;
int main (void)
{
    RIFF_PCM       file_data;
    RIFF_PCM       outFile_data;
    FILE           *inFilePointer;
    FILE           *outFilePointer;
    int     i;
    int     j;
    int     avgCounter = 1;
    prevCount                 = 0;
    gFcurrent                 = 0.0;
    gFpast                    = 1.0;
    /*---------------Copy 1st 64 Samples into Temp Buffer---------------*/
    write = &tempBuffer[0];
    /*Copy data to Integer Buffer*/
    fread(tempBufferInt, sizeof(short), InSize, inFilePointer);
    /*Copy Data to Float Buffer Using Casting*/
    for(i = 0; i < InSize; i++)
    {
        *(write + i) = (float)tempBufferInt[i];
    }
    /*---------------------Update 'write' Pointer--------------------*/
    bufferHalf = 1;
    write = tempBuffer + InSize;
    /*-------------------------PROCESS-----------------------------*/
    while (!feof(inFilePointer))
    {
        /*---------------Copy data to Integer Buffer-----------------*/
        fread(tempBufferInt, sizeof(short), InSize, inFilePointer);
        /*---------Copy Data to Float Buffer Using Casting----------*/
        for(i = 0; i < InSize; i++)
        {
            *(write + i) = (float)tempBufferInt[i];
        }
        for(i = 0; i < InSize; i++)
        {
            /*---------Find largest sample in next block of 64-------*/
            maxSample = 0.0;
            for(j = 0; j < InSize; j++)
            {
                if(fabs(tempBuffer[((prevCount + j)%
                        (2*InSize))]) > maxSample)
                {
                    maxSample = fabs(tempBuffer[((prevCount +
                                                j)%(2*InSize))]);
                }
```

```
                }
/*-----------Prevent a gain factor of infinity---------*/
if(maxSample == 0.0)
{
    maxSample = 2.0;
}
/*-------Calculate Gain required for current block-----*/
gFcurrent = (NormalizationLevel / maxSample);
/*--------Prevent over-scaling of quiet signals--------*/
if(gFcurrent > MaxGainValue)
{
    gFcurrent = MaxGainValue;
}
/*--------------Prevent Under-Scaling-----------------*/
if(gFcurrent < 1.0)
{
    gFcurrent = 1.0;
}
/*Find Gain for current output sample*/
/*Done by averaging the Current Gain Value (derived from
    the current 64-sample block) against the previous 2048
    gain values*/
/*Prevent gFpast From Shrinking too Slowly.
    Prevents Clipping*/
/*---ATTACK---*/
if(gFcurrent < gFpast)
{
    gFpast -= ((gFpast-gFcurrent)/1.03);
}
/*---RELEASE---*/
else        /*gFpast <= gFcurrent*/
{
    gFpast += (gFcurrent-gFpast)/655360;
    /*fade the algorithm back in slowly*/
}
/*----------------------AVERAGING SECTION--------------------*/
    /*---subtract oldest sample from 'sum'---*/
    sum -= avgBuffer[avgCounter % AvgWindowLength];
    /*---add newest sample to 'sum'---*/
    sum += fabs(tempBuffer[(prevCount % (2*InSize))]);
    /*---dump newest sample into the circular averaging
        buffer---*/
    avgBuffer[avgCounter % AvgWindowLength] =
        fabs(tempBuffer[(prevCount % (2*InSize))]);
/*---limit the buffer (window) length to 'avgWindowLength'--*/
    if(denominator >= AvgWindowLength)
    {
        denominator = AvgWindowLength;
    }
    else
    {
        denominator = avgCounter;
    }
    /*---find average---*/
    average = (sum / denominator);
    avgCounter++;
/*-----------------------------------------------------------*/
/*----------------AVERAGING CONTROL SECTION-----------------*/
if(average > TriggerLevel)
{
    if(gFpast == 1.0)
    {
        //Do Nothing
    }
    else
    {
        gFpast -= ((gFpast - 1.0) / 10000);
        if(gFpast < 1.03)
        {
            gFpast = 1.0;
        }
    }
}
else
{
    /*------Do Normal Processing------*/
}
/*-----------------------------------------------------------*/
/*---Cast Samples Back to 16b Before Writing to Output-*/
outSamples[i] =
    (short)(tempBuffer[(prevCount % (2*InSize))]*
gFpast);
fwrite(&outSamples[i], sizeof(short), 1, outFilePointer);
prevCount ++;
if((prevCount % InSize) == 0)
{
    if(bufferHalf == 1)
    {
        bufferHalf = 0;
        write = (tempBuffer + 0);
    }
    else if(bufferHalf == 0)
    {
        bufferHalf = 1;
        write = (tempBuffer + InSize);
    }
}
}
}
``` wherein the variables prevCount and avgCount count the samples, . . . .

Variations of the foregoing include replacing the normalization update limitation for the case of gFcurrent less than gFpast

```
if(gFcurrent < gFpast)
{
    gFpast -= ((gFpast-gFcurrent)/1.03);
}
``` with a simpler exact tracking of gFcurrent:

```
if(gFcurrent < gFpast)
{
    gFpast = gFcurrent;
}
```

Similarly, for the case of gFcurrent greater than gFpast the rate of fade can be larger by replacing with

```
else        /*gFpast <= gFcurrent*/
{
    gFpast += (gFcurrent-gFpast)/655360;
    /*fade the algorithm back in slowly*/
}
```

```
else        /*gFpast <= gFcurrent*/
{
    gFpast += (gFcurrent-gFpast)/163840;
    /*fade the algorithm back in slowly*/
}
``` and the recovery of the normalization after a drop (due to a jump in sample magnitude) could be generally done by:

gFpast=(((gFpast*HistWinSize)+gFcurrent)/
(HistWinSize+1));

with HistWinSize taken in the range. . . .

4. Third Preferred Embodiments

Third preferred embodiments modify some of the features of the foregoing preferred embodiments such as the normalization could be held at 1.0 for the first 10 seconds of playout in order to obtain initial sample statistics; that is, until the sample count (e.g., prevCount) reaches some level such as 480K (10 seconds at a sampling rate of 48 kHz). After this initialization interval, the foregoing adaptations of gFpast would apply.

Further, the updated normalization tracking of the current gain then the current gain is less than the prior normalization could be nonlinear. For example, when for gFpast−gFcurrent<0.01, the update could be exact tracking:

gFpast=gFcurrent;

and when gFpast−gFcurrent>0.01. the update could be tempered:

gFpast−=((gFpast−gFcurrent)/1.03);

Further, the normalization update method could also depend upon the average sample magnitude over the prior 1024 samples. For example, when the average is small, then the rapid update gFpast=gFcurrent tracks samples jumping from small to large; but when the average is large (but less than TriggerLevel) the update could be slower such as gFpast−=((gFpast−gFcurrent)/1.03).

5. Modifications

The preferred embodiments may be modified in various ways while retaining the feature of normalization for a streaming file.

For example, the various constants could be increased or decreased, such as MaxGainValue, TriggerLevel, InSize (the block size of 64 samples) AvgWindowLength (long-term average window); the current gain could be computed using the maximum over a larger or smaller window than the block size; the length of the initial normalization=1 period could be expanded or contracted, the normalization may be updated only every second output (so the current gain need only be computed for every second sample) or more, . . .

What is claimed is:

1. A method of normalization for streaming digital signals, comprising:
    (a) inputting a stream of digital signals into a playout buffer;
    (b) finding a current normalization gain for a current output digital signal from said playout buffer by the steps of:
        (i) finding the maximum digital signal magnitude of the digital signals in a sequence of digital signals in said playout buffer with said sequence including said current output digital signal where said current output digital signal precedes in said stream all other digital signals in said sequence,
        (ii) finding a gain factor for said current output digital signal using said maximum digital signal magnitude from (i),
        (iii) combining said gain factor from (ii) with a prior normalization gain for a prior output digital signal from said playout buffer when said gain factor is greater than said prior normalization gain, where said prior output digital signal precedes said current output digital signal in said stream;
    (c) outputting said current output digital signal from said playout buffer and modifying said current output digital signal with said normalization;
    (d) repeating steps (b) and (c) for a digital signal following said current output digital signal in said stream.

2. The method of claim 1, wherein:
    (a) periodically repeating said step (a) of claim 1.

3. The method of claim 1, wherein:
    (a) said combining of substep (iii) of step (b) of claim 1 is forming a piecewise linear combination of said prior normalization gain and said gain factor.

* * * * *